US008793214B2

(12) United States Patent
Qi

(10) Patent No.: US 8,793,214 B2
(45) Date of Patent: Jul. 29, 2014

(54) REDUCING AN AMOUNT OF DATA TRANSFER IN DATA SYNCHRONIZATION

(75) Inventor: Liang Qi, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 13/154,238

(22) Filed: Jun. 6, 2011

(65) Prior Publication Data

US 2012/0005161 A1    Jan. 5, 2012

(30) Foreign Application Priority Data

Jun. 30, 2010    (CN) .......................... 2010 1 0222614

(51) Int. Cl.
*G06F 17/30* (2006.01)
*H04N 21/47* (2011.01)
*H03M 7/40* (2006.01)
*H04L 12/28* (2006.01)

(52) U.S. Cl.
CPC ........... *G06F 17/30578* (2013.01); *H03M 7/40* (2013.01)
USPC .............................. 707/610; 709/248; 709/253

(58) Field of Classification Search
USPC ................................. 707/610; 709/248, 253
See application file for complete search history.

(56) References Cited

U.S. PATENT DOCUMENTS

| 5,884,325 | A | * | 3/1999 | Bauer et al. ............................ 1/1 |
| 6,925,476 | B1 | | 8/2005 | Multer et al. |
| 7,415,467 | B2 | | 8/2008 | Jeevanjee et al. |
| 8,171,171 | B2 | * | 5/2012 | Kim et al. ...................... 709/248 |
| 2009/0157802 | A1 | | 6/2009 | Kang et al. |
| 2009/0228509 | A1 | | 9/2009 | McCarthy et al. |
| 2009/0287762 | A1 | | 11/2009 | Gopal et al. |

FOREIGN PATENT DOCUMENTS

| CN | 101106477 | 1/2008 |
| WO | 2007087746 | 8/2007 |

OTHER PUBLICATIONS

US Publication No. 2009/0157802, dated Jun. 18, 2009, is an English language equivalent of WO2007087746, dated Aug. 9, 2007.
Office Action for CN Application No. 201010222614.6, dated Sep. 13, 2013, 7 pp. (w/ Translated Information Materials for IDS Doc, prepared Sep. 21, 2013) [57.241CN (OA1)].

* cited by examiner

*Primary Examiner* — Yicun Wu
(74) *Attorney, Agent, or Firm* — Janaki K. Davda; Konrad, Raynes, Davda & Victor LLP

(57) ABSTRACT

The disclosure discloses a method and system for reducing an amount of data transfer in data synchronization, in which the method comprises: identifying different data values in each data column within a changed source data table; coding data values in each data column, wherein, for each data column, different data values have different coding values; identifying different ChangeType and ChangeBits in data change history information; and generating a change matrix by using the coding values of different data values in each data column according to different ChangeType and ChangeBits. With the change matrix, data having the same change for different rows within an initial data change are merged into a same change row within the change matrix, thereby reducing amount of data transfer and improving synchronization efficiency.

18 Claims, 4 Drawing Sheets

REDUCING AN AMOUNT OF DATA TRANSFER IN DATA SYNCHRONIZATION

CROSS-REFERENCE TO RELATED FOREIGN APPLICATION

This application is a non-provisional application that claims priority benefits under Title 35, Unites States Code, Section 119(a)-(d) from Chinese Patent Application entitled "REDUCING AMOUNT OF DATA TRANSFER IN DATA SYNCHRONIZATION" by Liang Qi, having Chinese Patent Application No. 201010222614.6, filed on Jun. 30, 2010, which application is incorporated herein by reference in its entirety.

TECHNICAL FIELD OF THE INVENTION

The invention relates to the field of data synchronization. More particularly, the invention relates to reducing an amount of data transfer in data synchronization.

BACKGROUND OF THE INVENTION

With the development of computer networks, data synchronization technology is used more and more widely. Typically, a synchronization server or client located in a data synchronization system captures each of the changes that occurred in source data and records these changes. During data synchronization, these changes will be transmitted to a counterpart for the counterpart to apply them. Traditionally, each of the changes that occurred in source data needs to be transmitted to the counterpart. When a great number of changes occur in source data, since each of the changes needs to be transmitted to the counterpart, it will usually occupy a relatively large amount of bandwidth resource. Further, when the counterpart receives these changes, it needs to apply these changes one by one; it is a time consuming process if there are a lot of changes. In case of mobile data synchronization, since a mobile terminal has limited computing capability, this problem becomes even prominent.

SUMMARY OF THE INVENTION

Exemplary embodiments of the disclosure have recognized the above deficiencies in the art and provide a method and system for reducing an amount of data transfer in data synchronization to solve the problems in the art.

According to an aspect of the disclosure, there is provided a method for reducing an amount of data transfer in data synchronization, comprising: identifying different data values in each data column within a changed source data table; coding data values in each data column, wherein, for each data column, different data values have different coding values; identifying different ChangeType and ChangeBits in data change history information; and generating a change matrix by using the coding values of different data values in each data column according to different ChangeType and ChangeBits.

According to another aspect of the disclosure, wherein generating a change matrix by using the coding values of different data values in each data column according to different ChangeType and ChangeBits further comprises: generating a different ColumnValue by using the coding values of different data values in each data column according to different ChangeType and ChangeBits; and generating a PrimaryKeySet of a corresponding data record according to the different ColumnValue.

According to another aspect of the disclosure, wherein the change matrix at least comprises the following columns: ChangeType, ChangeBits, ColumnValue, and PrimaryKeySet of data record.

According to another aspect of the disclosure, when the counterpart receives the change matrix, it will generate SQL statements according to the change matrix and apply those statements to apply the changes, the changes with the same data values and change type will be applied together.

According to still another aspect of the disclosure, there is provided a system for reducing an amount of data transfer in data synchronization, comprising: a first identifying means configured to identify different data values in each data column within a changed source data table; a coding means configured to code data values in each data column, wherein, for each data column, different data values have different coding values; a second identifying means configured to identify different ChangeType and ChangeBits in data change history information; and a generating means configured to generate a change matrix by using the coding values of different data values in each data column according to different ChangeType and ChangeBits.

According to another aspect of the disclosure, wherein the generating means is further configured to: generate a different ColumnValue by using the coding values of different data values in each data column according to different ChangeType and ChangeBits; and generate a PrimaryKeySet of a corresponding data record according to the different ColumnValue.

According to another aspect of the disclosure, wherein the change matrix at least comprises the following columns: ChangeType, ChangeBits, ColumnValue and PrimaryKeySet of data record.

With the method and system of exemplary embodiments of the disclosure, changes that occurred in a same data set are compressed by generating a change matrix, and only the change matrix is transmitted during data synchronization, and, in the applying process in the counterpart, the changes with a same changed data set and type are applied together, thereby reducing an amount of data transfer, improving synchronization efficiency, and perfectly solving the problems in the art.

BRIEF DESCRIPTION OF THE DRAWINGS

The disclosure may be better understood with reference to the description given below in conjunction with the drawings, in which same or similar reference numbers are used to indicate same or similar elements throughout the drawings. The drawings, which are incorporated in this specification and constitute a part thereof, illustrate preferred embodiments of the disclosure and, together with the following detailed description, serve to explain the principles and benefits of the disclosure, in which.

DETAILED DESCRIPTION OF THE PREFERRED EMBODIMENTS

Figure 1:
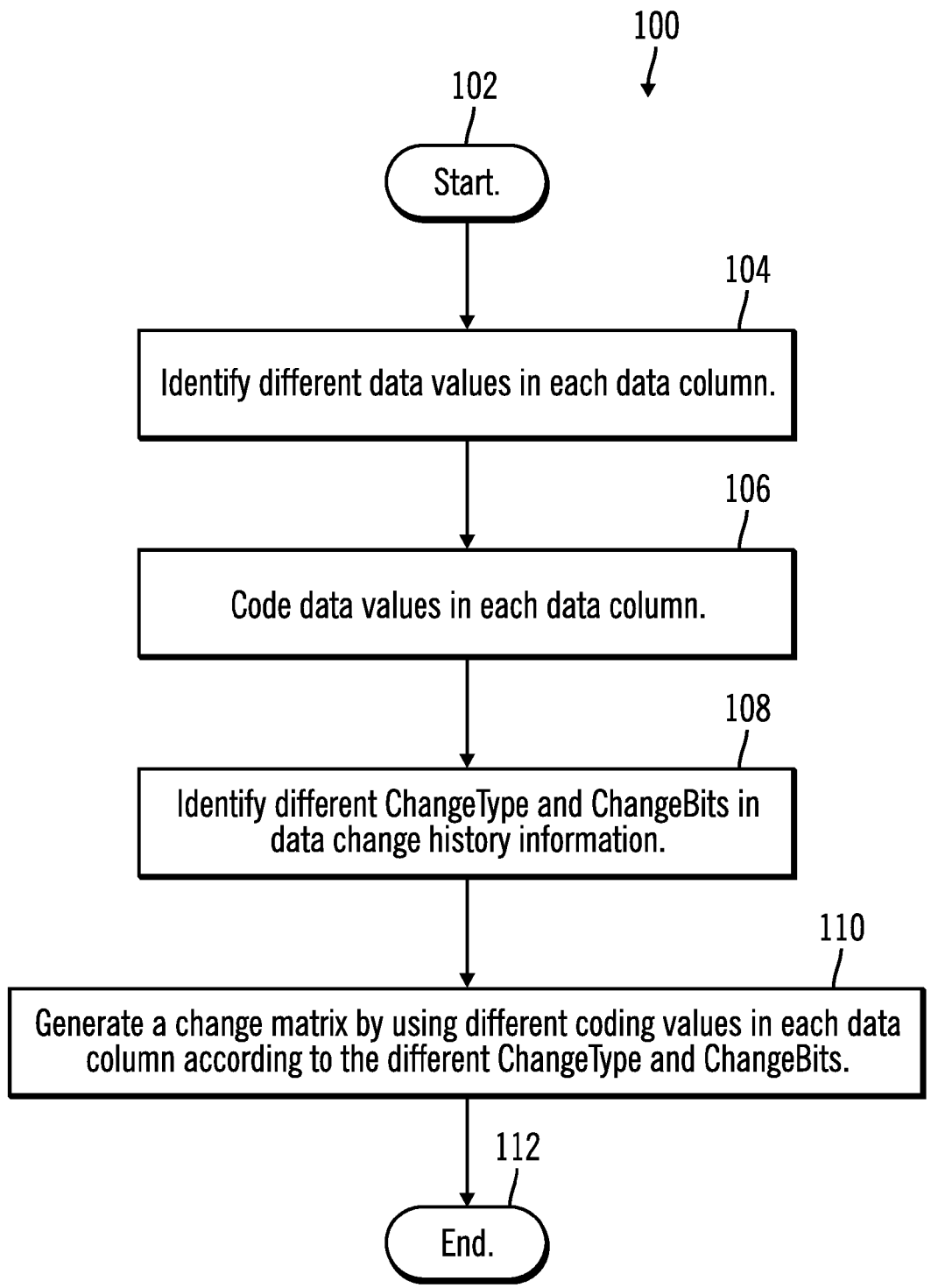
FIG. 1 depicts a method 100 for reducing an amount of data transfer in data synchronization according to an embodiment of the disclosure.

The exemplary embodiments of the disclosure will be described below in conjunction with drawings. For clarity and simplicity, not all features of an actual embodiment are described in the description. However, it should be appreciated that many decisions specific to that actual embodiment must be made during development of any such actual embodiment so as to achieve specific objects of developers, for instance, to comply with those system and business related limiting conditions which may vary with different embodiments. Also, it should be appreciated that, although such development task may be very complex and time-consuming, for those skilled in the art having benefits from the disclosure, such development is only a routine task.

In this regard, it should also be noted that, only apparatus structures and/or process steps that are closely related to the solution of the disclosure are shown in the drawings and other details that are not closely related to the disclosure are omitted, so that they will not obscure the discourse with unnecessary details.

Next, a method 100 for reducing an amount of data transfer in data synchronization according to an embodiment of the disclosure will be described in detail with reference to FIG. 1.

Referring to FIG. 1, the method 100 for reducing an amount of data transfer in data synchronization according to an embodiment of the disclosure starts with step 102.

Next, in step 104, different data values in each data column within a changed source data table are identified.

Then, the method proceeds to step 106, in which data values in each data column are coded, wherein, for each data column, different data values have different coding values.

Then, the method proceeds to step 108, in which different ChangeType and ChangeBits in data change history information are identified.

Then, the method proceeds to step 110, in which a change matrix is generated by using the coding values of different data values in each data column according to different ChangeType and ChangeBits.

different rows within the initial data change are merged into a same change row within the change matrix, thereby reducing an amount of data transfer during data synchronization, and in the applying process of the change matrix in counterpart, those changes in one same data record can be applied together; thereby synchronization efficiency is improved.

According to an embodiment of the disclosure, wherein the change matrix at least comprises the following columns: ChangeType, ChangeBits, ColumnValue, and PrimaryKeySet of data record.

According to an embodiment of the disclosure, further comprises: transmitting the generated change matrix.

The above method according to an embodiment of the disclosure will be described in detail through an example. Table 1 below illustratively presents an example of source data table, and this source data table has 4 columns, in which C1 is a primary key.

TABLE 1

| C1 | CNum | CChar | CVarChar |
|----|------|-------|----------|
| 1  | 0    | 'LOW' | 'aaaaa'  |
| 2  | 0    | 'LOW' | 'aaaaa'  |
| 3  | 0    | 'LOW' | 'aaaaa'  |
| 4  | 0    | 'LOW' | 'aaaaa'  |
| 5  | 0    | 'LOW' | 'aaaaa'  |
| 6  | 0    | 'LOW' | 'aaaaa'  |
| 7  | 0    | 'LOW' | 'aaaaa'  |
| 8  | 0    | 'LOW' | 'aaaaa'  |
| 9  | 0    | 'LOW' | 'aaaaa'  |
| 10 | 0    | 'LOW' | 'aaaaa'  |
| 11 | 0    | 'LOW' | 'aaaaa'  |
| 12 | 0    | 'LOW' | 'aaaaa'  |

Table 2 illustratively presents an example of data change history information stored in a synchronization server or client corresponding to source data Table 1.

TABLE 2

| C1 | CNum | CChar | CVarChar | From | To | ChangeType | ChangeBits |
|----|------|-------|----------|------|-----|------------|------------|
| 1  | 0 | 'LOW' | 'aaaaa' | 1 | ∞ | I | 111 |
| 2  | 0 | 'LOW' | 'aaaaa' | 1 | ∞ | I | 111 |
| 3  | 0 | 'LOW' | 'aaaaa' | 1 | ∞ | I | 111 |
| 4  | 0 | 'LOW' | 'aaaaa' | 1 | ∞ | I | 111 |
| 5  | 0 | 'LOW' | 'aaaaa' | 1 | ∞ | I | 111 |
| 6  | 0 | 'LOW' | 'aaaaa' | 1 | ∞ | I | 111 |
| 7  | 0 | 'LOW' | 'aaaaa' | 1 | ∞ | I | 111 |
| 8  | 0 | 'LOW' | 'aaaaa' | 1 | ∞ | I | 111 |
| 9  | 0 | 'LOW' | 'aaaaa' | 1 | ∞ | I | 111 |
| 10 | 0 | 'LOW' | 'aaaaa' | 1 | ∞ | I | 111 |
| 11 | 0 | 'LOW' | 'aaaaa' | 1 | ∞ | I | 111 |
| 12 | 0 | 'LOW' | 'aaaaa' | 1 | ∞ | I | 111 |

Then, the method ends in step 112.

According to an embodiment of the disclosure, generating a change matrix by using the coding values of different data values in each data column according to different ChangeType and ChangeBits further comprises: generating a different ColumnValue by using the coding values of different data values in each data column, and generating a PrimaryKeySet of a corresponding data record according to the different ColumnValue, ChangeBits and ChangeType.

With the change matrix, primary keys having the same change data in different rows within an initial data change are placed into a PrimaryKeySet of one same data record of a change matrix row, such that data having the same change for Referring to table 2, in which:

the $1^{st}$-$4^{th}$ column correspond to $1^{st}$-$4^{th}$ column in source data table.

"From" and "To" correspond to a relative version number of data and are used to indicate validity of data in the changed data row, in which "From" represents a version number at the time the changed change data row starts to exist, "To" represents a version number when the changed change data row expires (i.e., a new change occurs in the data row). For each change that occurred in source data, there is a corresponding row in the data change history information for recording the change, in which the value of "From" is a version number at the time the changed data row starts to exist, i.e., corresponding version number at the time the change occurs, the value of "To" is a version number when the changed data row expires. Thus, a valid period for each changed data row is from the time of "From" to that of "To". When the value of "To" is ∞, it means that the corresponding change data row is a current data row.

ChangeType is used to represent a type of data change, in which "I" represents a data insertion operation, "U" represents a data update operation, and "D" represents a data deletion operation.

ChangeBits is data in binary form, whose number of bits equals to number of data columns of source data subtracted by 1, each binary bit corresponds to a column other than the primary key column respectively, a value of each binary bit represents whether a data column in the corresponding source data has been changed. Taking Table 2 for example, the source data totally has 4 columns, in which the primary key column is C1, then ChangeBits has 3 bits, each binary bit thereof corresponds to CNum, CChar and CVarChar respectively. When the value of a binary bit in the example of Table 2 is 1, it represents that data column in corresponding source data has been changed, thus ChangeBits=111 represents that CNum, CChar and CVarChar in the corresponding source data have all been changed, the type of data change is data insertion operation (ChangeType=I). Of course, a value 0 of binary bit may also be used to represent that the data column in the corresponding source data has been changed.

Next, referring to Table 3, it illustratively presents the changed source data table. Wherein, all of CNum have been changed, and parts of CChar and CVarChar have been changed.

TABLE 3

| C1 | CNum | CChar | CVarChar |
|---|---|---|---|
| 1 | 1000 | 'LOW' | 'aaaaa' |
| 2 | 1000 | 'LOW' | 'aaaaa' |
| 3 | 1000 | 'LOW' | 'aaaaa' |

TABLE 3-continued

| C1 | CNum | CChar | CVarChar |
|---|---|---|---|
| 4 | 2000 | 'MIDDLE' | 'aaaaa' |
| 5 | 2000 | 'MIDDLE' | 'aaaaa' |
| 6 | 2000 | 'MIDDLE' | 'aaaaa' |
| 7 | 3000 | 'MIDDLE' | 'bbbbb' |
| 8 | 3000 | 'MIDDLE' | 'bbbbb' |
| 9 | 3000 | 'MIDDLE' | 'bbbbb' |
| 10 | 4000 | 'HIGH' | 'ccccc' |
| 11 | 4000 | 'HIGH' | 'ccccc' |
| 12 | 4000 | 'HIGH' | 'ccccc' |

Table 4 illustratively presents an example of data change history information stored in a synchronization server or client corresponding to Table 3 (i.e. the changed source data Table 1).

Now referring to Table 4, $1^{st}$-$12^{th}$ row thereof correspond to content of Table 1, and it differs from Table 2 in that, values of "To" from $1^{st}$-$12^{th}$ row of Table 4 become 2, which means that data rows (i.e., values of CNum, CChar and CVarChar in $1^{st}$-$12^{th}$ rows) are valid between version number 1 to version 2; since the value of "To" is not ∞, these data rows are not current data rows. The $13^{th}$-$24^{th}$ rows of Table 4 correspond to content in Table 3, in which CNum, CChar and CVarChar correspond to CNum, CChar and CVarChar of Table 3 respectively. The value of "From" is 2, the value of "To" is ∞, which means that these data rows are current data rows, and corresponding data are valid. The ChangeType is U, which means that the corresponding operation is a data update operation. ChangeBits are "100", "110" and "111" respectively, which represent whether the data update operation occurs in corresponding columns CNum, CChar and CVarChar respectively. Taking the $14^{th}$ row for example, the values of current CNum, CChar and CVarChar are "1000", "LOW" and "aaaaa" respectively, the value of "To" is ∞, which means that these data rows are current data rows, and the corresponding data are valid; the data update operation is performed on that data row, in which the data update operation is only performed on column CNum (i.e., its value is updated from "0" to "1000"), and CChar and CVarChar have not been changed.

TABLE 4

| C1 | CNum | CChar | CVarChar | From | To | ChangeType | ChangeBits |
|---|---|---|---|---|---|---|---|
| 1 | 0 | 'LOW' | 'aaaaa' | 1 | 1 | I | 111 |
| 2 | 0 | 'LOW' | 'aaaaa' | 1 | 1 | I | 111 |
| 3 | 0 | 'LOW' | 'aaaaa' | 1 | 1 | I | 111 |
| 4 | 0 | 'LOW' | 'aaaaa' | 1 | 1 | I | 111 |
| 5 | 0 | 'LOW' | 'aaaaa' | 1 | 1 | I | 111 |
| 6 | 0 | 'LOW' | 'aaaaa' | 1 | 1 | I | 111 |
| 7 | 0 | 'LOW' | 'aaaaa' | 1 | 1 | I | 111 |
| 8 | 0 | 'LOW' | 'aaaaa' | 1 | 1 | I | 111 |
| 9 | 0 | 'LOW' | 'aaaaa' | 1 | 1 | I | 111 |
| 10 | 0 | 'LOW' | 'aaaaa' | 1 | 1 | I | 111 |
| 11 | 0 | 'LOW' | 'aaaaa' | 1 | 1 | I | 111 |
| 12 | 0 | 'LOW' | 'aaaaa' | 1 | 1 | I | 111 |
| 1 | 1000 | 'LOW' | 'aaaaa' | 2 | ∞ | U | 100 |
| 2 | 1000 | 'LOW' | 'aaaaa' | 2 | ∞ | U | 100 |
| 3 | 1000 | 'LOW' | 'aaaaa' | 2 | ∞ | U | 100 |
| 4 | 2000 | 'MIDDLE' | 'aaaaa' | 2 | ∞ | U | 110 |
| 5 | 2000 | 'MIDDLE' | 'aaaaa' | 2 | ∞ | U | 110 |
| 6 | 2000 | 'MIDDLE' | 'aaaaa' | 2 | ∞ | U | 110 |
| 7 | 3000 | 'MIDDLE' | 'bbbbb' | 2 | ∞ | U | 111 |
| 8 | 3000 | 'MIDDLE' | 'bbbbb' | 2 | ∞ | U | 111 |
| 9 | 3000 | 'MIDDLE' | 'bbbbb' | 2 | ∞ | U | 111 |
| 10 | 4000 | 'HIGH' | 'ccccc' | 2 | ∞ | U | 111 |
| 11 | 4000 | 'HIGH' | 'ccccc' | 2 | ∞ | U | 111 |
| 12 | 4000 | 'HIGH' | 'ccccc' | 2 | ∞ | U | 111 |

The method according to one embodiment of the disclosure first identifies different data values in each data column. As to the example described above, Table 3 is a changed source data table, and its data columns are CNum, CChar and CVarChar respectively. For CNum, there are four different values, namely, 1000, 2000, 3000 and 4000; for CChar, there are three different values, namely, "LOW", "MIDDLE" and "HIGH"; and for CVarChar, there are three different values, namely, "aaaaa", "bbbbb" and "ccccc".

Then, the data values in each data column are coded, wherein, for each column, different data values have different coding values.

An example of coding is illustratively presented by Table 5.

TABLE 5

| CNum | | CChar | | CVarChar | |
|------|---|--------|---|----------|---|
| 1000 | 0 | 'LOW' | 0 | 'aaaaa' | 0 |
| 2000 | 1 | 'MIDDLE' | 1 | 'bbbbb' | 1 |
| 3000 | 2 | 'HIGH' | 2 | 'ccccc' | 2 |
| 4000 | 3 | | | | |

The above coding manner is just one example, and any coding manner in the art may be used, as long as it is assured that, for each column, different data values have different coding values.

Next, different ChangeType and ChangeBits in the data change history information are identified. Still taking the changed source data table of Table 3 for example, Table 4 is the data change history information stored in the synchronization server or client corresponding to Table 3. In Table 3, ChangeType has only one type "U", ChangeBits have three types, namely, "100", "110" and "111".

Next, a change matrix is generated by using the coding values of different data values in each data column according to different ChangeType and ChangeBits. According to an embodiment of the disclosure, different ColumnValue are generated by using the coding values of different data values in each data column according to different ChangeType and ChangeBits; and a PrimaryKeySet of a corresponding data record are generated according to the different ColumnValue.

Still taking Table 3 and Table 4 for example, wherein, ChangeType is "U", ChangeBits are "100", "110" and "111" respectively. Different ColumnValue are generated by using the coding values of different data values corresponding to data columns in Table 5 according to different ChangeType and ChangeBits. For example, for ChangeType=U, ChangeBits=100, the value of a corresponding data column is "1000" and its coding value is "0", thus the ColumnValue is "0"; for ChangeType=U, ChangeBits=110, the values of corresponding data columns are "2000" and "MIDDLE" and their coding values are "1" and "1", thus the ColumnValue is "11"; and so on. According to different ColumnValues, a PrimaryKeySet of corresponding data records is generated. For example, for the ColumnValue=0, the PrimaryKeySet is "1,2,3"; and so on. In this way, the change matrix obtained according to the above approach is shown in Table 6.

TABLE 6

| ChangeType | ChangeBits | ColumnValue | PrimaryKeySet |
|------------|------------|-------------|---------------|
| U | 100 | 0 | 1, 2, 3 |
| U | 110 | 11 | 4, 5, 6 |
| U | 111 | 211 | 7, 8, 9 |
| U | 111 | 322 | 10, 11, 12 |

If the method in the art is used, since all rows in the source data table have been changed, all the changes need to be transmitted during data synchronization, and the whole Table 3 will be transmitted. By using the above change matrix according to the disclosure, data changes are compressed, and only the change matrix needs to be transmitted during synchronization, thus the amount of data transferred during data synchronization is reduced, thereby reducing consumption of bandwidth resource.

Figure 2:
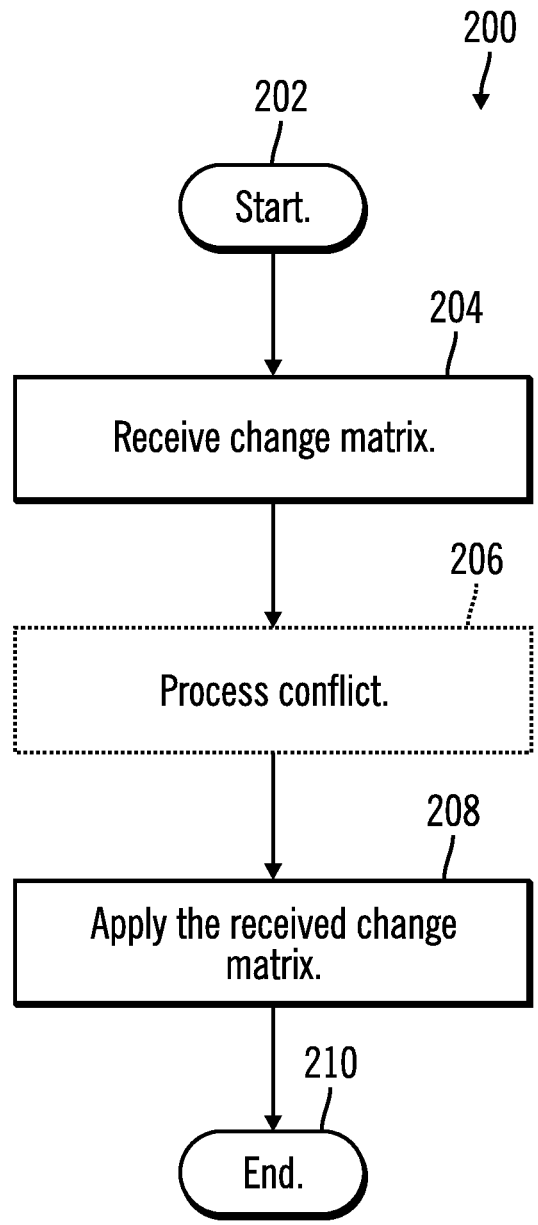
FIG. 2 depicts a method 200 for reducing an amount of data transfer in data synchronization according to another embodiment of the disclosure.

A method 200 for reducing an amount of data transfer in data synchronization according to another embodiment of the disclosure will be described below in detail with reference to FIG. 2.

The method 200 for reducing an amount of data transfer in data synchronization according to another embodiment of the disclosure starts with step 202.

Next, in step 204, a change matrix is received, wherein the change matrix is generated according to the above described approach.

Then, in step 208, the received change matrix is applied. Herein, during application of the received change matrix, for each row of the change matrix, a SQL statement that can change data in multiple rows corresponding to primary keys in a PrimaryKeySet of a data record is generated according to ChangeType, ChangeBits, and ColumnValue in that row, and the generated SQL statement is applied.

How to apply the change matrix will be described below by way of example. During application of the change matrix, for each row of the change matrix, according to ChangeType, ChangeBits, ColumnValue in that row, a SQL statement that can change data in multiple rows corresponding to primary keys in the PrimaryKeySet of the data record is generated and applied. As to the above example, the finally generated 4 pieces of SQL statements are (assume that table name is T1):

Update T1 set CNum=1000 where C1 in (1,2,3)
Update T1 set CNum=2000, CChar='Middle' where C2 in (4,5,6)
Update T1 set CNum=3000, CChar='Middle', CVarChar='bbbbb' where C1 in (7,8,9)
Update T1 set CNum=4000, CChar='High', CVarChar='ccccc' where C1 in (10,11,12)

If the method in the art is not used, since all rows in source data table have been changed, one corresponding SQL statement needs to be generated and applied according to each changed row when applying data, and correspondingly, 12 pieces of SQL statements need to be generated and applied in this example. By using the above change matrix to generate corresponding SQL statements according to the disclosure, correspondingly, only 4 pieces of SQL statements need to be generated and applied in this example, thus efficiency of data application and synchronization is improved.

Alternatively, according to an embodiment of the invention, the method 200 for reducing an amount of data transfer in data synchronization further comprises a step 206 of processing conflict, in which if a counterpart that receives the change matrix also generates a change matrix itself, then it is determined whether the received change matrix has the same primary key as that in the change matrix generated by the counterpart that receives the change matrix itself; if there is a same primary key, then the received change matrix is applied after the conflict is resolved by a conflict resolution mechanism. The description will be given below by taking the example that the server change matrix is preferable. It should be appreciated that, any conflict resolution mechanism in the art may be used.

Assume the change matrix generated at server end is:

| ChangeType | ChangeBits | ColumnValue | PrimaryKeySet |
|------------|------------|-------------|---------------|
| U | 100 | 0 | 1, 2, 3 |
| U | 110 | 11 | 4, 5, 6 |
| U | 111 | 211 | 7, 8, 9 |
| U | 111 | 322 | 10, 11, 12 |

Assume that data change also occurs at a client simultaneously, and the following change matrix is generated, conflict is generated for rows 1, 3, service end is changed to 0, and client end is changed to 2:

| ChangeType | ChangeBits | ColumnValue | PrimaryKeySet |
|---|---|---|---|
| U | 100 | 2 | 1, 3 |
| U | 111 | 222 | 13, 14 |

At this point in resolving the conflict, since the server is preferable, i.e., change at the server end will substitute that at the client end, the first row in the client change matrix will be ignored, and then the change matrix to be applied at the client end is still:

| ChangeType | ChangeBits | ColumnValue | PrimaryKeySet |
|---|---|---|---|
| U | 100 | 0 | 1, 2, 3 |
| U | 110 | 11 | 4, 5, 6 |
| U | 111 | 211 | 7, 8, 9 |
| U | 111 | 322 | 10, 11, 12 |

Whereas the change matrix to be applied at server end becomes:

| ChangeType | ChangeBits | ColumnValue | PrimaryKeySet |
|---|---|---|---|
| U | 111 | 222 | 13, 14 |

Then, the method 200 ends in step 210.

Figure 3:
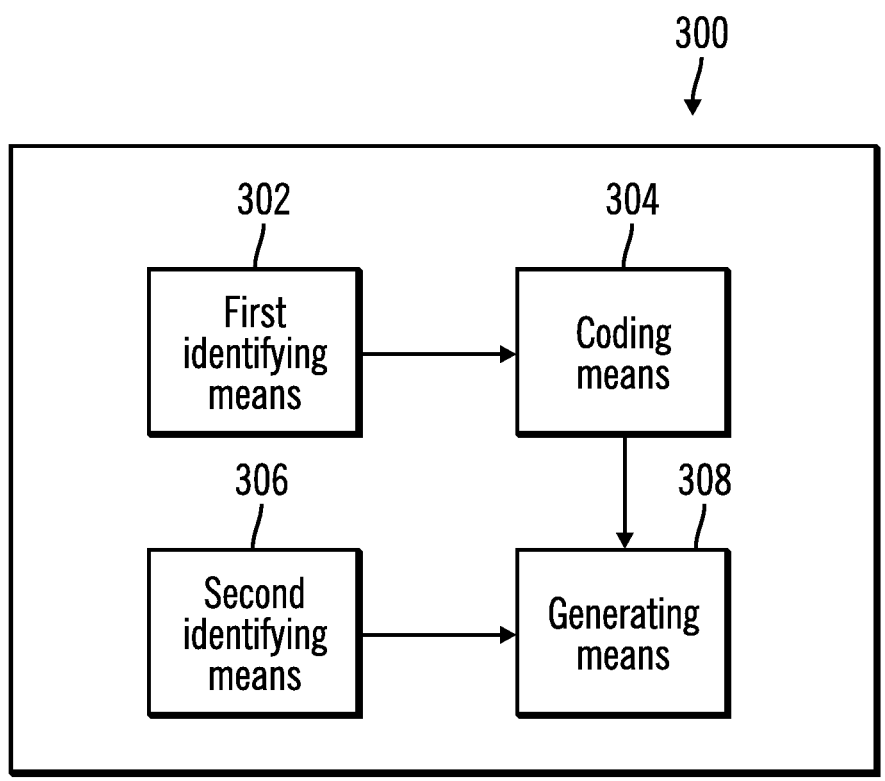
FIG. 3 depicts a system 300 for reducing an amount of data transfer in data synchronization according to an embodiment of the disclosure.

A system 300 for reducing an amount of data transfer in data synchronization according to an embodiment of the disclosure will be described below in detail with reference to FIG. 3.

According to an embodiment of the disclosure, the system 300 for reducing an amount of data transfer in data synchronization comprises: a first identifying means 302 configured to identify different data values in each data column within a changed source data table; a coding means 304 configured to code data values in each data column, wherein, for each data column, different data values have different coding values; a second identifying means 306 configured to identify different ChangeType and ChangeBits in data change history information; and a generating means 308 configured to generate a change matrix by using the coding values of different data values in each data column according to different ChangeType and ChangeBits.

According to an embodiment of the disclosure, wherein the generating means is further configured to: generate different ColumnValue by using the coding values of different data values in each data column; and generate a PrimaryKeySet of a corresponding data record according to the different ColumnValue, ChangeType and ChangeBits.

According to an embodiment of the disclosure, wherein the change matrix at least comprises the following columns: ChangeType, ChangeBits, ColumnValue, and PrimaryKeySet of data record.

According to an embodiment of the disclosure, further comprising: a transmitting means 310 configured to transmit the generated change matrix.

Figure 4:
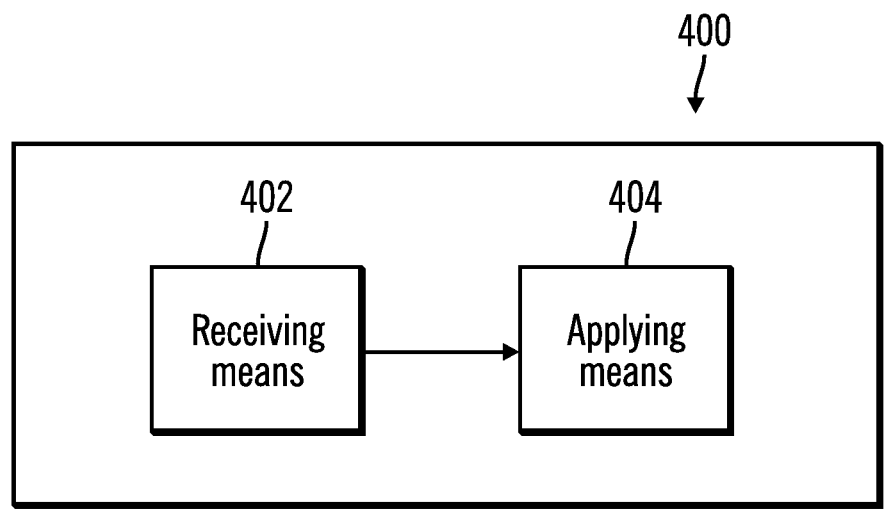
FIG. 4 depicts a system 400 for reducing an amount of data transfer in data synchronization according to another embodiment of the disclosure.

A system 400 for reducing an amount of data transfer in data synchronization according to another embodiment of the disclosure will be described below in detail with reference to FIG. 4.

According to an embodiment of the disclosure, the system 400 for reducing an amount of data transfer in data synchronization comprises: a receiving means 402 configured to receive a change matrix generated according to the above described method for reducing an amount of data transfer; and an applying means 404 configured to apply the received change matrix, wherein the applying means 404 is further configured to: during application of the change matrix, for each row of the change matrix, generate a SQL statement that can change data in multiple rows corresponding to primary keys in a PrimaryKeySet of a data record according to ChangeType, ChangeBits, ColumnValue in that row; and apply the generated SQL statement.

According to an embodiment of the disclosure, wherein the applying means 404 is further configured to: if the counterpart that receives the change matrix also generates a change matrix itself, then determine whether the received change matrix has the same primary key as that in the change matrix generated by the counterpart that receives change matrix itself; if there is same primary key, then apply the received change matrix after conflict is resolved by conflict resolution mechanism.

The basic principle of the disclosure is described above in conjunction with specific embodiments; however, it should be noted that, those skilled in the art can appreciated that all or any step or means of the method and apparatus of the disclosure may be implemented in any computing means (including processor, storage medium etc) or network of computer means in hardware, firmware, software, or a combination of thereof, and this can be achieved by those skilled in the art by using their basic programming skill after reading the description of the disclosure.

Thus, the object of the disclosure may also be implemented by running a program or a set of programs on any computing means. The computing means may be known general purpose means. Thus, the object of the disclosure may also be implemented merely by providing program product which contains program code for implementing the method or apparatus. That is, such program product can constitute the disclosure, and storage medium in which such program product is stored can also constitute the disclosure. Obviously, the storage medium may be any known storage medium or any storage medium that will be developed in future.

It should also be noted that, in the apparatus and method of the disclosure, obviously, each means or step can be decomposed and/or recombined. Such decomposition and/or recombination should be viewed as equivalent solution of the disclosure. Further, steps for performing the above series of processes may be performed according to the mentioned order naturally in time sequence, but not necessarily in time sequence. Some steps may be performed in parallel or independently with each other.

Although the disclosure and its benefits have been described in detail, it should be appreciated that various modifications, replacements and changes may be made without departing from the spirit and scope of the disclosure defined by appended claims. Further, terms "including", "containing" or any other variations in the application are intended to encompass non-exclusive inclusion, such that process, method, article or means containing a series of elements include not only those elements, but other elements not listed explicitly, or include elements inherent to such process, method, article or means. Without further limitation, element defined by phrase "including a . . . " does not exclude that the process, method, article or means that contain that element also contained therein other same element.

The invention claimed is:

1. A method for reducing an amount of data transfer in data synchronization, comprising:
- identifying different data values in each data column within a changed source data table;
- identifying different ChangeType and ChangeBits in data change history information, wherein the ChangeType represents a type of data change, and wherein the ChangeBits includes a bit for each data column that indicates whether that data column has been changed;
- generating a PrimaryKeySet for each different ColumnValue, wherein the PrimaryKeySet stores primary keys for different rows having that different ColumnValue; and
- generating a change matrix that includes, for each different ColumnValue, a row including the ChangeType, the ChangeBits, the ColumnValue, and the PrimaryKeySet.

2. The method according to claim 1, wherein the ColumnValue represents a coded value, and wherein, for each data column, different data values have different coding values.

3. The method according to claim 1, further comprising:
- transmitting the generated change matrix.

4. The method of claim 1, further comprising:
- receiving the generated change matrix; and
- applying the received change matrix.

5. The method according to claim 4, wherein applying the received change matrix comprises:
- for each row of the received change matrix, generating a SQL statement that can change data in multiple rows corresponding to the primary keys in the PrimaryKeySet according to a ChangeType, a ChangeBits, and a ColumnValue in that row; and
- applying the generated SQL statement.

6. The method according to claim 4, further comprising:
- generating a new change matrix at a counterpart;
- determining whether the received change matrix has a primary key that is a same as a primary key in the generated new change matrix; and
- in response to determining that the primary key is the same, resolving conflict; and
- applying the received change matrix.

7. A system for reducing an amount of data transfer in data synchronization, comprising:
- a processor; and
- a storage medium couple to the processor, wherein the storage medium stores program code, and wherein the program code is executed by the processor to perform operations, and wherein the operations comprise:
- identifying different data values in each data column within a changed source data table;
- identifying different ChangeType and ChangeBits in data change history information, wherein the ChangeType represents a type of data change, and wherein the ChangeBits includes a bit for each data column that indicates whether that data column has been changed;
- generating a PrimaryKeySet for each different ColumnValue, wherein the PrimaryKeySet stores primary keys for different rows having that different ColumnValue; and
- generating a change matrix that includes, for each different ColumnValue, a row including the ChangeType, the ChangeBits, the ColumnValue, and the PrimaryKeySet.

8. The system according to claim 7, wherein the ColumnValue represents a coded value, and wherein, for each data column, different data values have different coding values.

9. The system according to claim 7, wherein the operations further comprise:
- transmitting the generated change matrix.

10. The system according to claim 7, wherein the operations further comprise:
- receiving the generated change matrix; and
- applying the received change matrix.

11. The system according to claim 10, wherein the operations for applying the received change matrix further comprise:
- for each row of the received change matrix, generate a SQL statement that can change data in multiple rows corresponding to the primary keys in the PrimaryKeySet according to a ChangeType, a ChangeBits, and a ColumnValue in that row and apply the generated SQL statement.

12. The system according to claim 10, wherein the operations further comprise:
- generating a new change matrix at a counterpart;
- determining whether the received change matrix has a primary key that is a same as a primary key in the generated new change matrix; and
- in response to determining that the primary key is the same, resolve conflict; and
- apply the received change matrix.

13. A program product, which contains program code in a storage medium, for reducing an amount of data transfer in data synchronization, wherein the program code, when executed by a processor, performs:
- identifying different data values in each data column within a changed source data table;
- identifying different ChangeType and ChangeBits in data change history information, wherein the ChangeType represents a type of data change, and wherein the ChangeBits includes a bit for each data column that indicates whether that data column has been changed;
- generating a PrimaryKeySet for each different ColumnValue, wherein the PrimaryKeySet stores primary keys for different rows having that different ColumnValue; and
- generating a change matrix that includes, for each different ColumnValue, a row including the ChangeType, the ChangeBits, the ColumnValue, and the PrimaryKeySet.

14. The program product according to claim 13, wherein the ColumnValue represents a coded value, and wherein, for each data column, different data values have different coding values.

15. The program product of claim 13, wherein the program code, when executed by a processor, performs:
- receiving the generated change matrix; and
- applying the received change matrix.

16. The program product according to claim 15, wherein, when applying the received change matrix, the program code, when executed by a processor, performs:
- for each row of the received change matrix, generating a SQL statement that can change data in multiple rows corresponding to the primary keys in the PrimaryKeySet according to a ChangeType, a ChangeBits, and a ColumnValue in that row; and
- applying the generated SQL statement.

17. The program product according to claim 15, wherein the program code, when executed by a processor, performs:
- generating a new change matrix at a counterpart;
- determining whether the received change matrix has a primary key that is a same as a primary key in the generated new change matrix; and in response to determining that the primary key is the same,
resolving conflict; and
applying the received change matrix.

18. The program product of claim 13, wherein the program code, when implemented in the computing means, performs:
transmitting the generated change matrix.

* * * * *